(12) United States Patent
Chu et al.

(10) Patent No.: US 6,949,761 B2
(45) Date of Patent: Sep. 27, 2005

(54) STRUCTURE FOR AND METHOD OF FABRICATING A HIGH-MOBILITY FIELD-EFFECT TRANSISTOR

(75) Inventors: Jack O. Chu, Manhasser Hills, NY (US); Steven J. Koester, Ossining, NY (US); Qiqing C. Ouyang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/685,013

(22) Filed: Oct. 14, 2003

(65) Prior Publication Data

US 2005/0077510 A1 Apr. 14, 2005

(51) Int. Cl.[7] .............................................. H01L 31/109
(52) U.S. Cl. ........................... 257/19; 257/18; 257/190; 257/E21.182; 257/E21.207; 257/E29.193; 257/E31.049; 438/22
(58) Field of Search ............................ 257/18, 19, 190, 257/E21.182, E21.207, E29.193, E31.049; 438/22

(56) References Cited

U.S. PATENT DOCUMENTS

2003/0102490 A1 * 6/2003 Kubo et al. ................ 257/192

* cited by examiner

*Primary Examiner*—Nathan J. Flynn
*Assistant Examiner*—Scott R. Wilson
(74) *Attorney, Agent, or Firm*—Scully, Scott, Murphy & Presser; Robert M. Trepp, Esq.

(57) ABSTRACT

A structure and method of fabricating a high-mobility semiconductor layer structure and field-effect transistor (MODFET) that includes a high-mobility conducting channel, while at the same time, maintaining counter doping to control deleterious short-channel effects. The MODFET design includes a high-mobility conducting channel layer wherein the method allows the counter doping to be formed using a standard technique such as ion implantation, and further allows the high-mobility channel to be in close proximity to the counter doping without degradation of the mobility.

67 Claims, 10 Drawing Sheets

STRUCTURE FOR AND METHOD OF FABRICATING A HIGH-MOBILITY FIELD-EFFECT TRANSISTOR

CROSS REFERENCE TO RELATED APPLICATIONS

This application relates to commonly owned, co-pending U.S. patent application Ser. No. 10/652,400 entitled ULTRA HIGH-SPEED SI/SIGE MODULATION-DOPED FIELD EFFECT TRANSISTORS ON ULTRA THIN SOI/SGOI SUBSTRATE, filed Aug. 29, 2003, the whole contents and subject matter of which is incorporated by reference as if fully set forth herein.

This invention was made with Government support under contract number N66001-00-C-8086 awarded by DARPA. The Government has certain rights in this invention.

BACKGROUND OF THE INVENTION

1. Field of the Invention

The present invention relates to semiconductors and transistors and more particularly to Si/SiGe strained-layer field-effect transistors.

2. Description of the Prior Art

Si/SiGe strained layer heterostructures are interesting devices for future high-performance microelectronics applications. In particular, tensile-strained Si on relaxed SiGe MOSFETs have been proposed for advanced CMOS applications, while Si/SiGe modulation-doped field-effect transistors (MODFETs) are of interest for advanced communications applications. Field-effect transistors based upon Si/SiGe strained layers have the common feature that they rely on enhanced mobility to achieve performance improvement. This is especially true for tensile-strained Si on relaxed SiGe MODFETs which can have mobility enhancement factors of 3–5 times for electrons as described in the reference to K. Ismail, entitled "Si/SiGe high-speed field-effect transistors," *Tech. Dig. Int. Electron Devices Meet.*, 509 (1995) (herein incorporated by reference) and for compressive-strained Ge on relaxed SiGe MODFETs which have hole mobility over 10 times higher than bulk Si MOSFETs as described in the reference to S. J. Koester, R. Hammond, J. O. Chu, entitled "Extremely high transconductance Ge/Si$_{0.4}$Ge$_{0.6}$ p-MODFET's grown by UHV-CVD," *IEEE Elect. Dev. Lett.* 21, 110 (2000) (herein incorporated by reference).

However, in order to make a high-performance FET, device design factors in addition to mobility must be considered. In particular, control of short-channel effects is a serious issue for devices with very short gate lengths as recognized by Q. C. Ouyang, S. J. Koester, J. O. Chu, A. Grill, S. Subbanna, and D. A. Herman Jr., at the International Conference on Simulation of Semiconductor Processes and Devices, Kobe, Japan, Sep. 4–6, 2002. In Si MOSFETs, short-channel effects are generally controlled through counter-doping, i.e., introducing carriers of the opposite type into the body of the device in order to maintain a high built-in potential between the source and drain p/n junctions. In Si MOSFETs, counter doping is generally introduced by ion implantation directly through the active area of the device.

As for SiGe MODFETs, however, implantation of dopants through the active device area can seriously degrade the mobility. The mobility degradation occurs because the trailing edge of the implant profile intersects the high-mobility channel. Since impurity concentrations as low as $10^{15}$ cm$^{-2}$ can degrade the mobility, even implants with peak concentrations well below the channel region cannot be used. Therefore, it is essential in SiGe MODFETs that the channel region be completely free of implanted impurities in order to maintain the high mobility. An example of the deleterious effect of ion implantation through a Si/SiGe n-channel MODFET structure is shown in the plot of FIG. 1($a$) illustrating curves 15 showing decreased electron mobility with implant impurities present as compared to the curves 12 showing no implant impurities present.

One possible option for MODFETs is simply to eliminate the counter-doping, a practice common in III–V devices. However, unlike III–V devices, where high band-gap barrier layers can reduce parallel conduction, the SiGe barrier layers do no provide this opportunity. A demonstration of the need for counter-doping in Si/SiGe n-MODFETs is shown in the plot of FIG. 1($b$), which shows experimental data of a scaled Si/SiGe n-MODFET with no p-well along with physical simulations of a very similar device with p-type counter doping. The device without counter doping (p-well) shows severe short-channel effects and large source/drain leakage current, while the simulations show that with the proper p-well doping the same device would exhibit near ideal subthreshold behavior.

To date, no method of introducing counter doping into SiGe MODFETs have been explicitly suggested. However, the concept of incorporating the doping via an in situ doping process has been proposed and implemented using tensile-strained Si surface channel MOSFETs in the reference to K. Rim, J. L. Hoyt, J. F. Gibbons, entitled "Fabrication and analysis of deep submicron strained-Si N-MOSFET's," *IEEE Trans. on Elect. Dev.* 47, 1406 (2000). However, this technique is not applicable for a layer structure grown on a pre-fabricated relaxed SiGe substrate where the regrown layer structure needs to be kept thin, since the doping is only incorporated in the epitaxially regrown layer, and therefore the underlying substrate could still act as a leakage path. A good example of this is situation occurs for a MODFET fabricated on a buried insulating layer, where the typical fabrication scheme would be to first produce a wafer of relaxed SiGe on insulator, and then regrow the MODFET layer structure on top. In this situation, in situ doping of the p-well during growth would still leave the original SiGe substrate undoped. In situ doping is also a problem for p-channel SiGe MODFETs, since the counter doping would have to be n-type, and many common n-type dopants have a high surface affinity during growth, segregating to the surface and causing unintentional dopant incorporation into the channel layer.

It would thus be highly desirable to produce a high-mobility semiconductor layer structure and field-effect transistor exhibiting a high-mobility conducting channel, while at the same time, maintaining counter doping to control deleterious short-channel effects. It would also be highly desirable to provide a method of fabricating such a layer structure and transistor.

SUMMARY OF THE INVENTION

It is thus an object of the present invention to provide a high-mobility semiconductor layer structure and field-effect transistor that includes a high-mobility conducting channel, while at the same time, maintaining counter doping to control deleterious short-channel effects.

According to one embodiment of the invention, there is provided a semiconductor layer structure comprising: a relaxed Si$_{1-x}$Ge$_x$ layer, a portion of which is doped p-type;

a bottom $Si_{1-z}Ge_z$ buffer layer on top of the relaxed $Si_{1-x}Ge_x$ layer, where the Ge concentration, z, is such that said bottom buffer layer is substantially lattice-matched to said relaxed $Si_{1-x}Ge_x$ layer; a tensile-strained Si quantum well layer on top of the bottom $Si_{1-z}Ge_z$ buffer layer; a top $Si_{1-m}Ge_m$ buffer layer on top of the tensile-strained Si quantum well layer; and a tensile-strained Si cap layer on top of the top $Si_{1-m}Ge_m$ buffer layer.

In a further embodiment, the relaxed $Si_{1-x}Ge_x$ layer has a Ge concentration, x and relaxation, r such that the in-plane lattice constant is 0.8–2.4% larger than that of bulk Si, and includes a p-type doped portion with a concentration ranging between $10^{15}$ cm$^{-3}$ and $10^{19}$ cm$^{-3}$; and said bottom $Si_{1-z}Ge_z$ buffer layer has thickness ranging from 2 nm to 50 nm, and said tensile-strained Si quantum well layer, and said top $Si_{1-m}Ge_m$ buffer layer has thickness ranging from 2 nm to 20 nm.

In a further embodiment, a thin $Si_{1-y}Ge_y$ layer may be interposed between the top of the relaxed $Si_{1-x}Ge_x$ layer and bottom buffer layer having with a Ge concentration, y, in the range of 0 to 20%, and thickness in the range of 1 to 5 nm.

In a further embodiment, said relaxed $Si_{1-x}Ge_x$ layer may be a on a buried insulating layer, said relaxed $Si_{1-x}Ge_x$ layer having a thickness of 5 to 100 nm.

It is another object of the present invention to provide a method of fabricating a high-mobility semiconductor layer structure and field-effect transistor that includes a high-mobility conducting channel wherein the method allows the counter doping to be formed using a standard technique such as ion implantation or in situ doping, and further allows the high-mobility channel to be in close proximity to the counter doping without degradation of the mobility.

Advantageously, a high-performance n-MODFET transistor device may be formed by additionally providing an insulating gate dielectric on top of the Si cap layer; a gate electrode located on top of the insulating gate dielectric; and, n-type source and drain contact regions located on either side of said gate electrode that extend from a surface of the multi-layer structure into the p-type doped portion of the relaxed $Si_{1-x}Ge_x$ layer. It is understood that p-type MODFET devices may be formed according to the principles of the invention.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENT

Figure 1A:
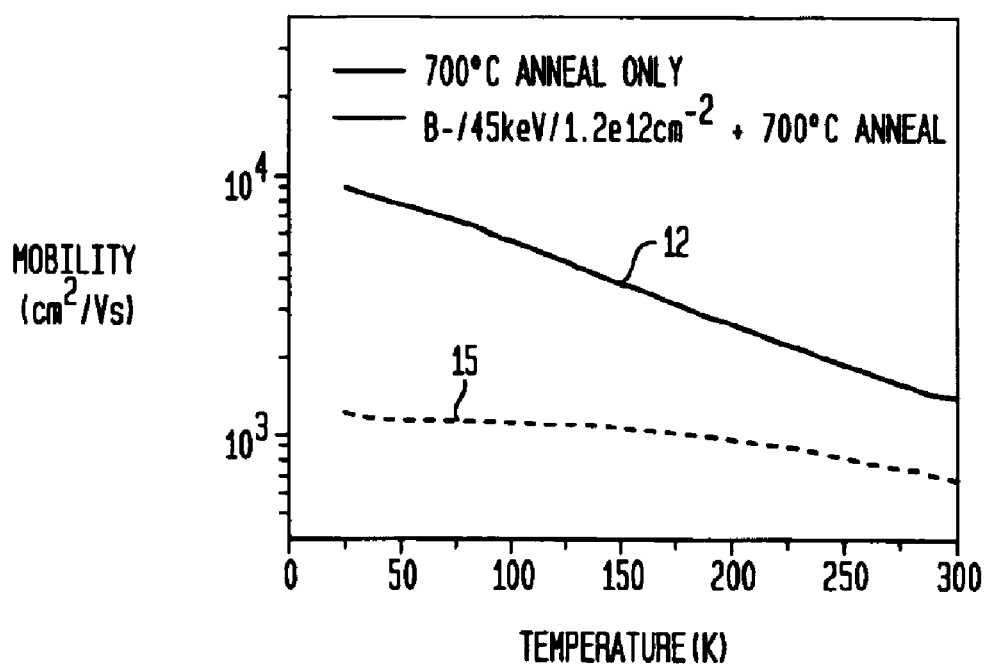
FIG. 1(a) is a graph depicting the mobility vs. temperature for an n-type modulation-doped layer structure with and without p-well implantation.
Figure 1B:
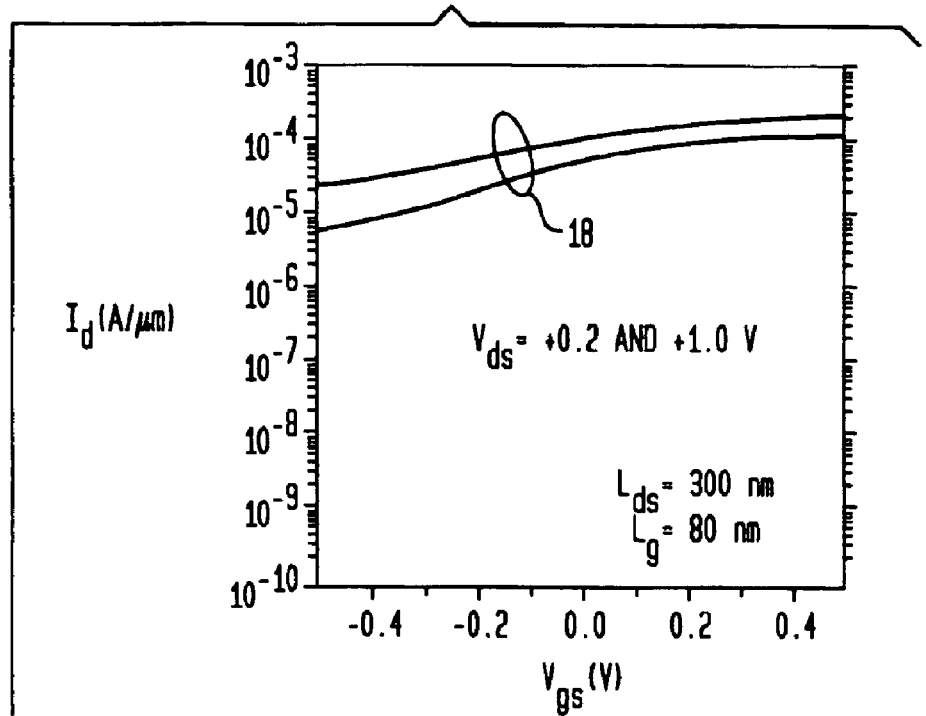
FIG. 1(b) are experimental $I_d$ vs. $V_{gs}$ curves at $V_{ds}$=0.2 and 1 V for SiGe n-MODFETs without p-well doping; and simulated $I_d$ vs. $V_{gs}$ curves at $V_{ds}$=0.2 and 1 V for SiGe n-MODFETs with p-well doping.
Figure 1B:
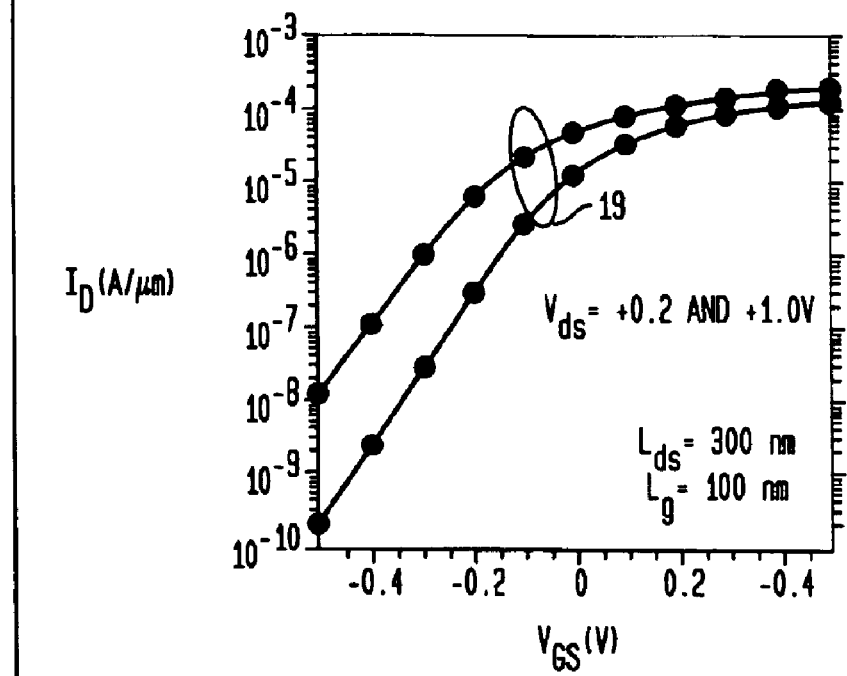
Figure 2:
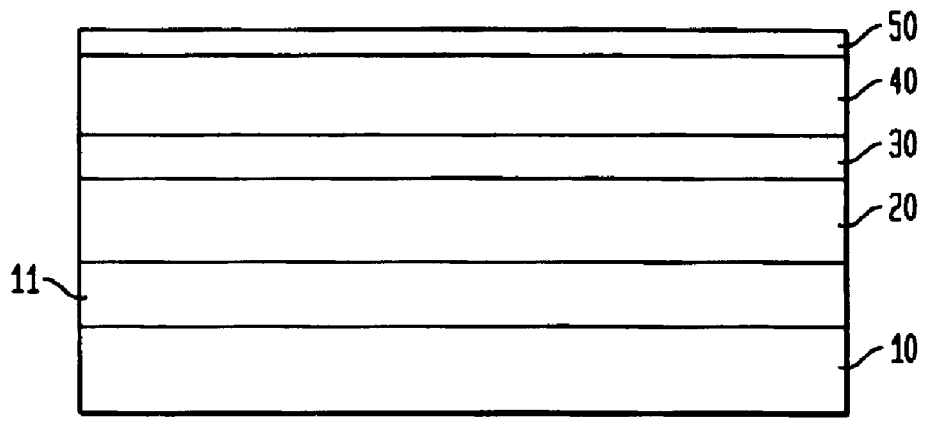
FIG. 2 is a schematic cross-sectional view of an undoped tensile-strained Si quantum well layer structure with p-type doped body.

FIG. 2 is a schematic cross-sectional view of an undoped tensile-strained Si quantum well layer structure with p-type doped body according to a preferred embodiment of the invention. The layer structure comprises a relaxed $Si_{1-x}Ge_x$ layer 10, where a portion of this layer is doped p-type. The possible range of p-type dopant concentration is between $10^{15}$ and $10^{19}$ cm$^{-3}$, and in the preferred embodiment the concentration is ideally between $10^{16}$ and $10^{18}$ cm$^{-3}$. In one embodiment said p-type doped portion may be a top portion 11 of the relaxed layer 10 as shown in FIG. 2, however, the whole or a substantial portion of the relaxed layer 10 may be doped p-type. The Ge concentration, x, and relaxation, r, of layer 10 should be such that the in-plane lattice constant is 0.8–2.4% larger than that of relaxed Si, with preferred values in the range of 1.2 to 1.8%. On top of this layer is bottom $Si_{1-z}Ge_z$ buffer layer 20, where the Ge concentration z, is such that layer 20 is roughly lattice-matched to layer 10. On top of bottom $Si_{1-z}Ge_z$ buffer layer 20 is tensile-strained Si layer 30, followed by top $Si_{1-m}Ge_m$ buffer layer 40, and optionally, Si cap layer 50. In general, top $Si_{1-m}Ge_m$ buffer layer 40, bottom $Si_{1-z}Ge_z$ buffer layer 20 and $Si_{1-x}Ge_x$ layer 10 are not required to have the same Ge concentration, though in the preferred embodiment, the Ge concentrations of the three layers are about the same. In this embodiment, high mobility in tensile-strained Si layer 30 is maintained because the p-well doping is restricted to the underlying $Si_{1-x}Ge_x$ layer 10, separated from the quantum well by bottom $Si_{1-z}Ge_z$ buffer layer 20. Ideally, the thickness of bottom $Si_{1-z}Ge_z$ buffer layer 20 should be sufficiently thin to allow the p-well doping to effectively control short-channel effects, but thick enough to prevent mobility degradation. The possible range of thickness for bottom $Si_{1-z}Ge_z$ buffer layer 20 is from 2 nm to 50 nm, with preferred values of between 10 and 30 nm. Also, in the preferred embodiment, the thickness of tensile-strained Si layer 30 is such that it is less than the critical thickness for misfit dislocation formation at the interface between bottom $Si_{1-z}Ge_z$ buffer layer 20 and tensile-strained Si layer 30. Also, in the preferred embodiment, the combined thicknesses of top $Si_{1-m}Ge_m$ buffer layer 40 and Si cap layer 50 are no more than 20 nm.

Figure 3:
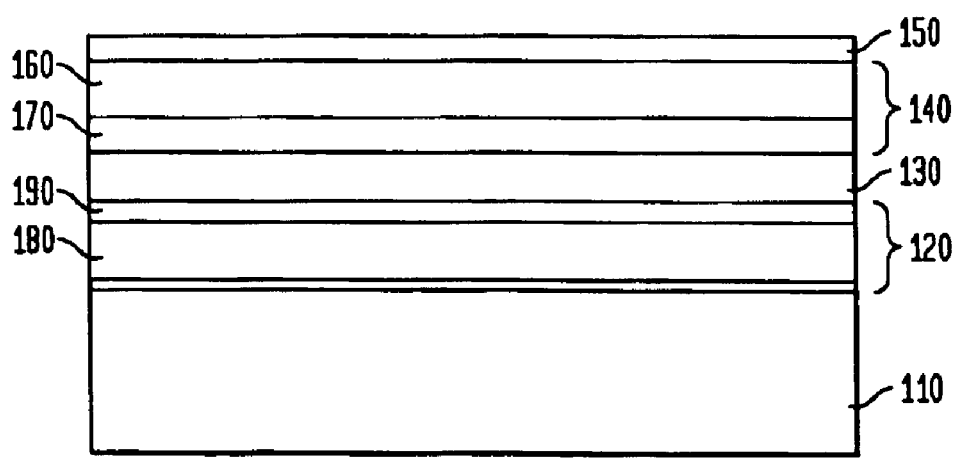
FIG. 3 is a schematic cross-sectional view of a tensile-strained Si quantum well layer structure with n-type modulation doping and p-type doped body.

According to the invention, n-type modulation doping may be incorporated into the layer structure as shown in FIG. 3. In particular, n-type modulation doping with a concentration between $10^{17}$ and $10^{21}$ cm$^{-2}$ may be incorporated into either top $Si_{1-m}Ge_m$ buffer layer 140 or bottom $Si_{1-z}Ge_z$ buffer layer 120, or both, with the provision that at least a portion of each layer immediately adjacent to Si quantum well 130, remain substantially undoped. In this case, bottom $Si_{1-z}Ge_z$ buffer layer 120, is split into n-type supply layer 180, and substantially undoped spacer layer 190, and top $Si_{1-m}Ge_m$ buffer layer 140, is divided into n-type supply layer 160, and substantially undoped spacer layer 170. The thickness of undoped spacer layers 170 and 190 must be at least 0.5 nm, to ensure that the high mobility is maintained in Si quantum well 130. In the preferred embodiment, the n-type doping in n-type supply layers 160 or 180 or both has concentration in the range of $10^{18}$ to $10^{20}$ cm$^{-3}$. Also, the preferred thickness of doped n-type supply layer 160 is in the range from 5 nm to 15 nm, and the preferred thickness of undoped spacer layer 170 is in the range from 2 nm to 8 nm. The thicknesses of layers 160 and 170 should also be such that their combined thickness is no more than 20 nm.

Figure 4:
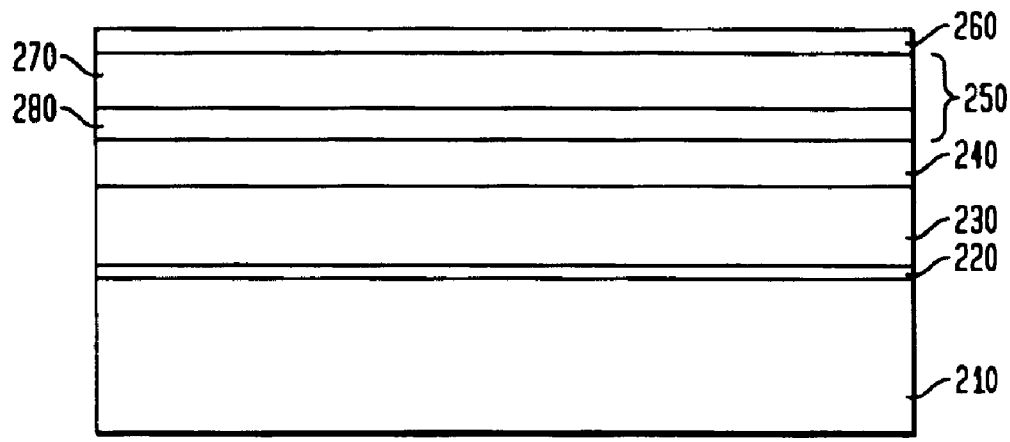
FIG. 4 is a schematic cross-sectional view of a tensile-strained Si quantum well layer structure with n-type modulation doping, p-type doped body and a SiGe interposer layer.

FIG. 4 shows a schematic cross-sectional view of another embodiment of the invention where a thin interposer layer 220 of $Si_{1-y}Ge_y$, where y<20%, is placed between relaxed $Si_{1-x}Ge_x$ layer 210 and $Si_{1-z}Ge_z$ buffer layer 230. In FIG. 4, layers 240, 250 and 260 correspond respectively to layers 130, 140 and 150 of FIG. 3. The interposer layer 220 may help to getter contamination, mainly C and O, before the subsequent layers 230–280 are grown on top of layer 210. By reducing contamination, the interposer layer may permit Si quantum well 240 to be closer to the p-type doped region of relaxed $Si_{1-x}Ge_x$ layer 210, thereby allowing better short-channel control, while still maintaining high mobility. In the preferred embodiment, the thickness of interposer layer 220 should be between 1 nm and 5 nm, and the Ge concentration, y, is less than 10%.

Figure 5:
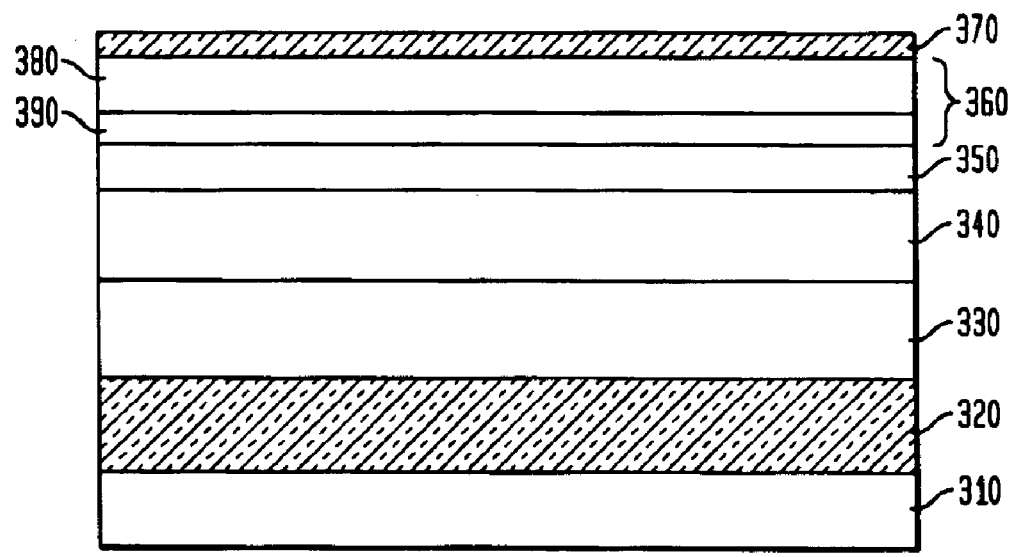
FIG. 5 is a schematic cross-sectional view of a tensile-strained Si quantum well layer structure with n-type modulation doping, and p-type doped body on a buried insulating layer.

The layer structures described herein may additionally incorporate a buried insulating layer. As an example, FIG. 5 shows one embodiment comprising from bottom to top, an Si substrate 310, and buried insulator layer 320, which in the preferred embodiment, may comprise an oxide, nitride, oxynitride of silicon, and preferably $SiO_2$. Next is relaxed $Si_{1-x}Ge_x$ layer 330, which can be completely or partially doped p-type. On top of this layer is bottom $Si_{1-z}Ge_z$ buffer layer 340, where the Ge concentration z, is such that layer 340 is roughly lattice-matched to layer 330. On top of bottom $Si_{1-z}Ge_z$ buffer layer 340 is tensile-strained Si layer 350, followed by top $Si_{1-m}Ge_m$ buffer layer 360, and optionally, Si cap layer 370. In FIG. 5, top-side modulation doping is shown, which divides $Si_{1-m}Ge_m$ buffer layer 360 into n-type supply layer 380, and substantially undoped spacer layer 390. Though top-side modulation doping is shown FIG. 5, layer structures with top and/or bottom, or no modulation doping are also possible. The thin interposer layer of $Si_{1-y}Ge_y$, described in FIG. 4, may also be utilized in the embodiment illustrated in FIG. 5, and would be located between relaxed $Si_{1-x}Ge_x$ layer 330 and bottom $Si_{1-z}Ge_z$ buffer layer 340. In this embodiment, the preferred range of doping levels, Ge concentrations, strain levels and layer thicknesses are the same as in the previous embodiments.

Figure 6:
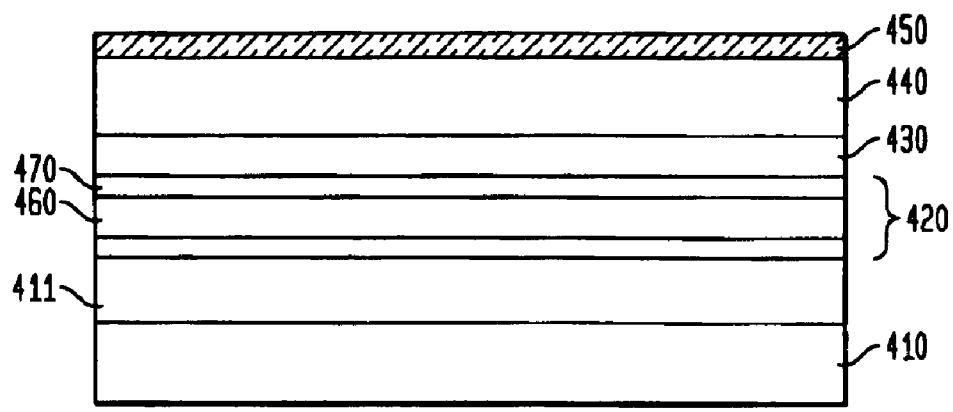
FIG. 6 is a schematic cross-sectional view of a compressive-strained SiGe quantum well layer structure with p-type modulation doping and n-type doped body.

The concept of using a buried layer with counter-doping for a tensile-strained Si n-channel heterostructure, may also be applied to a strained p-channel heterostructure. FIG. 6 is a schematic cross-sectional view of a strained SiGe quantum well layer structure with p-type modulation doping and n-type doped body according to another embodiment of the invention. In this embodiment, the layer structure is a high-mobility p-channel heterostructure comprising a relaxed $Si_{1-x}Ge_x$ layer 410, where the top portion 411 of this layer is doped n-type. It is understood however, that the whole or a substantial portion of the relaxed layer 410 may be doped n-type. The possible range of n-type dopant concentration is between $10^{15}$ and $10^{19}$ cm$^{-3}$, and in the preferred embodiment the concentration is ideally between $10^{16}$ and $10^{18}$ cm$^{-3}$. The Ge concentration, x, and relaxation, r, of layer 410 are such that the in-plane lattice constant is 0–3.2% larger than that of relaxed Si, with preferred values in the range of 1.2% to 2.4%. Formed on top of this layer is bottom $Si_{1-z}Ge_z$ buffer layer 420, where the Ge concentration z, is such that layer 420 is roughly lattice-matched to layer 410. On top of layer 420 is strained $Si_{1-v}Ge_v$ layer 430, where, v>z, such that strained $Si_{1-v}Ge_v$ layer 430 is under compressive strain thus forming a quantum well for holes. In the preferred embodiment, v>z+0.3. On top of layer 430 is formed top $Si_{1-m}Ge_m$ buffer layer 440, and Si cap layer 450. In general, top $Si_{1-m}Ge_m$ buffer layer 440, bottom $Si_{1-z}Ge_z$ buffer layer 420 and $Si_{1-x}Ge_x$ layer 410 are not required to have the same Ge concentration, though in the preferred embodiment, the Ge concentrations of the three layers are about the same. Also, in another embodiment of the invention either $Si_{1-m}Ge_m$ buffer layer 440, or Si cap layer 450, but not both, could be omitted from the layer structure, because either of these layers can produce the required band offset to provide confinement of the holes in strained $Si_{1-v}Ge_v$ layer 430.

In FIG. 6, p-type modulation doping is incorporated within bottom $Si_{1-z}Ge_z$ buffer layer 420. In this case, bottom $Si_{1-z}Ge_z$ buffer layer 420, is divided into p-type supply layer 460, and substantially undoped spacer layer 470. The thickness of undoped spacer layer 470 must be at least 0.5 nm, to ensure that the high mobility is maintained in $Si_{1-v}Ge_v$ quantum well 430. Similar to layer structures in FIGS. 2–5, the layer structure in FIG. 6 may also include modulation doping in either bottom $Si_{1-z}Ge_z$ buffer layer 420 or top $Si_{1-m}Ge_m$ buffer layer 440 or both, a buried insulating layer under $Si_{1-x}Ge_x$ buffer layer 410, and/or a $Si_{1-y}Ge_y$ interposer layer between bottom $Si_{1-z}Ge_z$ buffer layer 420, and $Si_{1-x}Ge_x$ layer 410. The possible range of thickness for $Si_{1-z}Ge_z$ buffer layer 420 is from 2 nm to 50 nm, with preferred values of between 10 and 30 nm. Also, in the preferred embodiment, the thickness of strained $Si_{1-v}Ge_v$ layer 430 is such that it is less than the critical thickness for misfit dislocation formation at the interface between bottom $Si_{1-z}Ge_z$ buffer layer 420 and strained $Si_{1-v}Ge_v$ layer 430, and the combined thicknesses of $Si_{1-m}Ge_m$ buffer layer 440 and Si cap layer 450 are no more than 20 nm.

Figure 7:
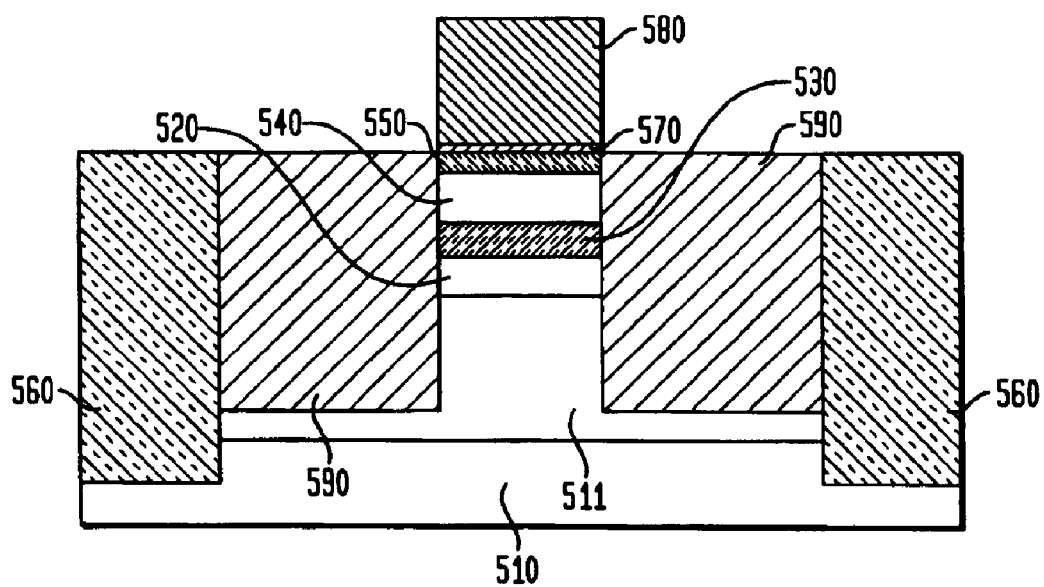
FIG. 7 is a schematic cross-sectional view of an n-type field-effect transistor with an undoped tensile-strained Si quantum well layer structure, n-type modulation doping, p-type doped body and self-aligned source/drain contacts.

The current invention additionally comprises field-effect transistors incorporating the layer structures described herein with respect to FIGS. 2–6. The essential components of the field-effect transistors of the invention are shown in FIG. 7, which shows a schematic cross-sectional view of a n-type transistor with a buried p-well region. In its simplest form, the transistor incorporates the layer structure shown in FIG. 2, which comprises a relaxed $Si_{1-x}Ge_x$ layer 510, having a portion 511 of this layer doped p-type, followed by bottom $Si_{1-z}Ge_z$ buffer layer 520, where the Ge concentration z, is such that layer 520 is roughly lattice-matched to layer 510. On top of bottom $Si_{1-z}Ge_z$ buffer layer 520 is tensile-strained Si layer 530, followed by top $Si_{1-m}Ge_m$ buffer layer 540, and optionally, Si cap layer 550. The device structure shown in FIG. 7 further comprises trench isolation regions 560 that penetrate into relaxed $Si_{1-x}Ge_x$ layer 510, a gate dielectric layer 570, a gate electrode 580, and n-type source and drain contact regions 590 that are self-aligned to the gate electrode. Preferably, the gate dielectric layer 570 comprises an oxide, nitride, oxynitride of silicon, and oxides and silicates of Hf, Al, Zr, La, Y, Ta, singly or in combinations, while the gate electrode 580 may comprise polysilicon, polysilicongermanium, or metals such as Pt, Ir, W, Pd, Al, Au, Ni, Cu, Ti, Co and their silicides and germanosilicides, either singly or in combinations. The N-type source and drain contact regions 590 are deep enough such that they penetrate into but not through the p-type region 511 of relaxed $Si_{1-x}Ge_x$ layer 510. Therefore, conduction is blocked between source and drain through relaxed $Si_{1-x}Ge_x$ layer 510 due to the presence of back-to-back p-n junctions. High-mobility is maintained since the channel region (tensile-strained Si layer 530) remains substantially undoped.

Figure 8:
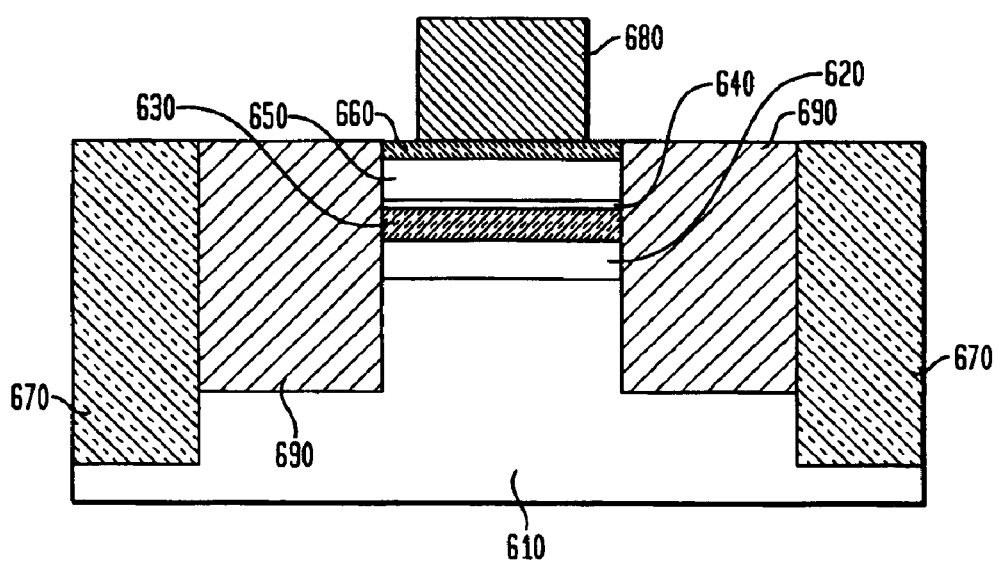
FIG. 8 is a schematic cross-sectional view of an n-type field-effect transistor with a tensile-strained Si quantum well layer structure, n-type modulation doping and p-type doped body.

In the embodiment of the invention depicted in FIG. 7, the gate electrode 580 is isolated from the source and drain by gate dielectric 570. In addition, source and drain contact regions 590 must be overlapped by the gate slightly to ensure continuity between source and drain. In another embodiment of the invention, modulation doping may be used to populate the channel, thus allowing offset source and drain regions. Such an embodiment is shown in FIG. 8 which depicts a schematic cross-sectional view of an n-type field-effect transistor with a tensile-strained Si quantum well layer structure, n-type modulation doping and p-type doped body. In this embodiment, the layer structure comprises a relaxed $Si_{1-x}Ge_x$ layer 610, the top part of which is doped p-type, followed by bottom $Si_{1-z}Ge_z$ buffer layer 620, tensile-strained Si layer 630, undoped $Si_{1-m}Ge_m$ spacer layer 640, n-type doped $Si_{1-m}Ge_m$ supply layer 650 and, optionally, a Si cap layer 660. The device structure further includes trench isolation regions 670 that penetrate into relaxed $Si_{1-x}Ge_x$ layer 610, a Schottky gate electrode 680, and n-type source and drain contact regions 690 that penetrate into the p-type region of relaxed $Si_{1-x}Ge_x$ layer 610. In this embodiment, because the modulation-doping populates tensile-strained Si layer 630, the source and drain contacts may be offset from the gate electrode. This enables source and drain contact regions 690 to be farther apart, which in turn, reduces the concentration of p-type doping in relaxed $Si_{1-x}Ge_x$ layer 610 required to control short channel effects. Additionally, modulation-doped eliminates the need for a strong forward gate bias, thus reducing the parasitic population of Si cap layer 660. In the embodiment depicted in FIG. 8, the Schottky gate electrode 680 is preferably metal, with contact metal having a high work function. Preferred metals for this contact include, but are not limited to: Ir, Pt and Pd. The embodiment depicted in FIG. 8 may additionally utilize an insulating gate as in FIG. 7, but does not require one.

The device embodiments shown and described in view of FIGS. 7 and 8 may additionally incorporate other variations of the layer structure described in FIGS. 2–6. Specifically, the devices may incorporate a layer structure on a buried insulating layer, as shown in FIG. 5. In this embodiment, the isolation-trenches and the source/drain contract regions would extend down to the buried insulating (e.g. oxide) layer. The buried insulating layer would reduce the capacitance of the source/drain junctions, and provide additional benefit in controlling short-channel effects. The device embodiments depicted may additionally include a p-type field-effect transistor by utilizing the layer structure in FIG. 6, and p-type source and drain regions.

Figure 9A:
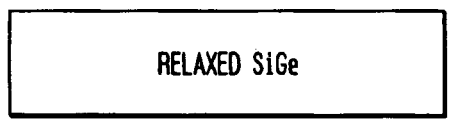
FIG. 9 depicts a process sequence for growing the layer structure shown in FIG. 4; and, FIGS. 10(a)–10(c) depict experimental data of an n-MODFET layer structure with a p-type implanted SiGe substrate.
Figure 9B:
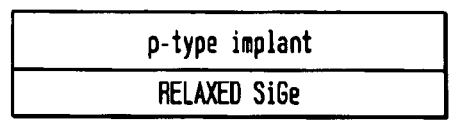
Figure 9C:
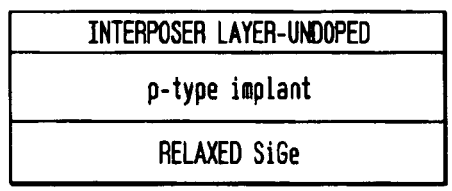
Figure 9D:
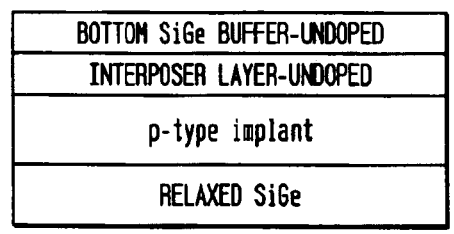
Figure 9E:
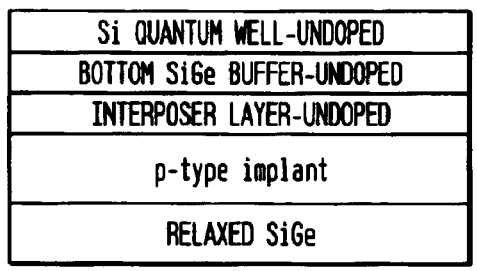

The invention additionally includes a methodology for fabricating the multi-layer structures described in FIGS. 2–6. One embodiment of the invention shown in FIG. 9, depicts a method for fabricating the multi-layer structure described in FIG. 4. The method starts with a partially or fully relaxed $Si_{1-x}Ge_x$ layer as shown in FIG. 9(a). The Ge concentration, x, and relaxation, r, of relaxed $Si_{1-x}Ge_x$ layer are such that the in-plane lattice constant is 0.8–2.4% larger than that of relaxed Si. Relaxed $Si_{1-x}Ge_x$ layer may be fabricated in a number of ways, but the typical method is to grow a graded SiGe buffer layer on a Si substrate, where the Ge concentration is slowly graded from x=0 to the final Ge concentration, x. Next, as shown in FIG. 9(b), the relaxed $Si_{1-x}Ge_x$ layer is implanted with a p-type dopant species. In the preferred embodiment, this dopant would include B or In, or a combination of the two. The sample is then annealed to activate the dopants. The annealing may occur at a temperature necessary to properly activate the dopants, and typically range between 700–1100° C. In the next processing the wafer is cleaned to prepare the surface for regrowth. In one embodiment of the invention, the first regrown layer is a thin (i.e., less than 5 nm) interposer or seed $Si_{1-y}Ge_y$ layer, as depicted in FIG. 9(c), where the Ge concentration, y, is in the range of 0 to 20%. This layer helps to getter contaminants, particularly, C and O, at the regrowth interface so they do not segregate into the subsequent regrown layers. On top of this layer is grown the bottom $Si_{1-z}Ge_z$ buffer layer as depicted in FIG. 9(d), where the Ge concentration z, is such that this layer is roughly lattice-matched to the relaxed $Si_{1-x}Ge_x$ layer. Next, as shown in FIG. 9(e), the tensile-strained Si quantum well is grown, followed by a top $Si_{1-m}Ge_m$ buffer layer (FIG. 9(f)) and, finally, a Si capping layer (FIG. 9(h)). In one embodiment of the invention, all of the regrown layers are substantially undoped. In another embodiment of the invention, the layers are grown at a temperature or temperatures in the range of 350° C. to 600° C.

Figure 9F:
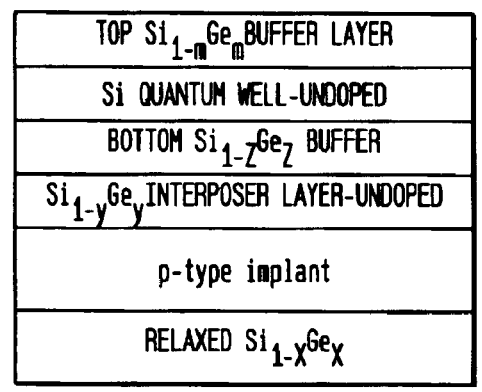
Figure 9G:
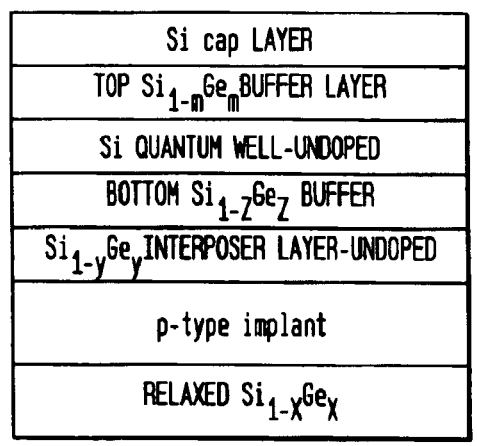

In another embodiment of the invention as described herein, modulation-doping may be incorporated in the following way: after growing the tensile-strained Si quantum well as depicted in FIG. 9(f), a portion of the top $Si_{1-m}Ge_m$ buffer layer is grown such that it is substantially undoped, and has thickness of at least 0.5 nm. Then, a remaining portion of top $Si_{1-m}Ge_m$ buffer layer is grown with n-type doping to form n-type supply layer. In the preferred embodiment, the n-type dopant is P, As or Sb. Finally, the Si capping layer is grown, which may or may not include n-type doping. A similar method may be used for doping the bottom $Si_{1-z}Ge_z$ buffer n-type, with the provision that the Si quantum well and the region of bottom $Si_{1-z}Ge_z$ buffer within 0.5 nm of the Si quantum well must remain substantially undoped.

In yet another embodiment of the invention, there is utilized a reduced growth temperature for the $Si_{1-y}Ge_y$ interposer layer and the $Si_{1-z}Ge_z$ bottom buffer layer (FIG. 9(c) and 9(d)), in order to prevent three-dimensional growth associated with elastic relaxation. The temperature is then ramped back up to the nominal growth temperature during the growth of the Si quantum well, and for the subsequent layers. In the preferred embodiment, the growth temperature for the $Si_{1-y}Ge_y$ interposer layer is between 450° C. and 550° C., and the growth temperature for the $Si_{1-z}Ge_z$ bottom buffer layer is between about 350° C. and 500° C.

Figure 10A:
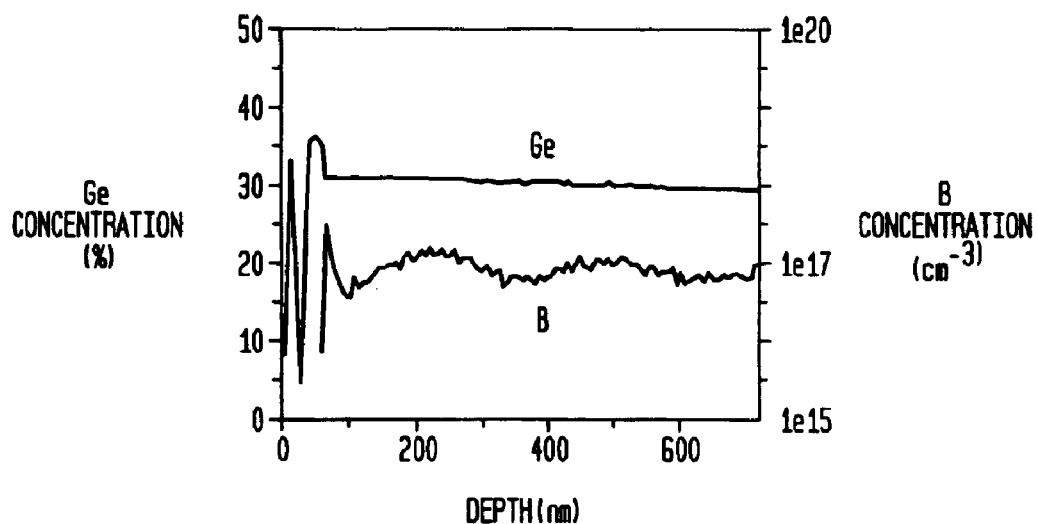
Figure 10B:
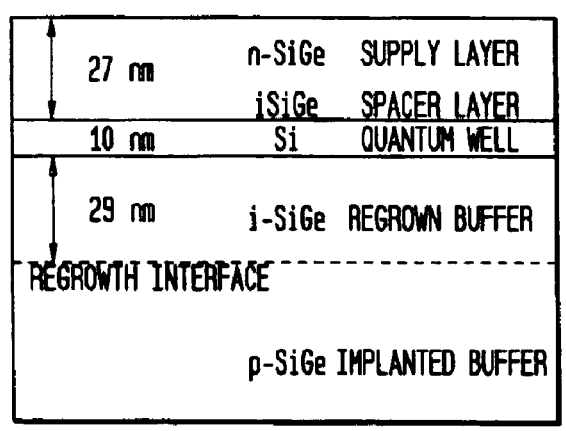
Figure 10C:
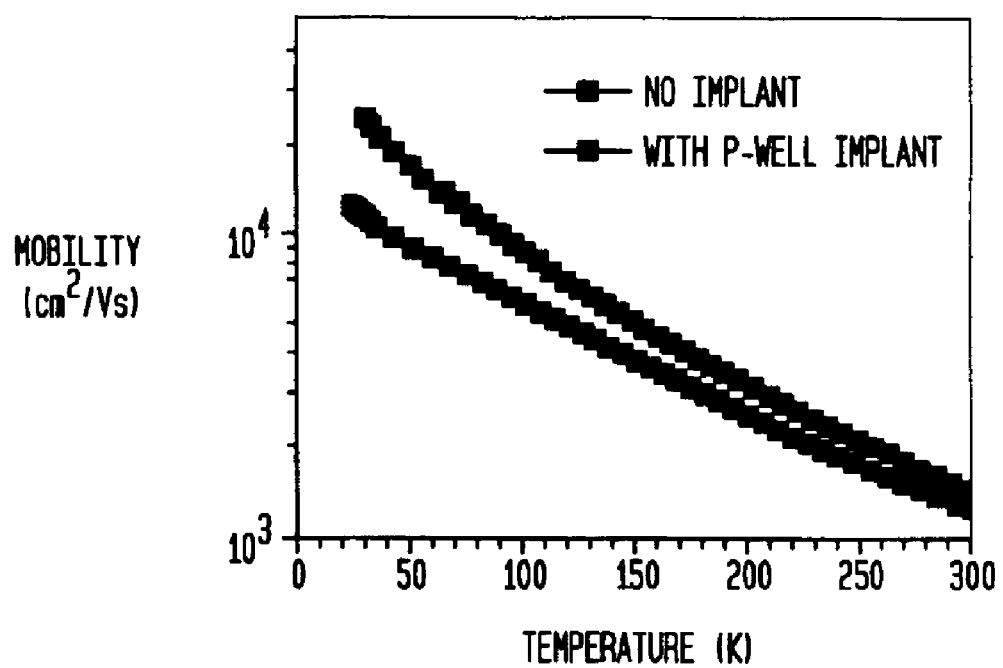

The basic principle of this invention is demonstrated as shown with reference to FIGS. 10(a)–10(c) which depict experimental data of a MODFET layer structure regrown on a p-well implanted SiGe substrate. FIG. 10(a) particularly depicts a secondary ion mass spectroscopy (SIMS) plot of the multi-layer structure with implanted p-well doping, and regrown Si/SiGe modulation-doped quantum well layer structure and FIG. 10(b) depicts a corresponding cross-sectional transmission electron micrograph (XTEM) of the multi-layer structure shown in FIG. 10(a). As shown in FIGS. 10(a) and 10(b), the data illustrates that smooth regrowth is obtained by using the technique of reduced growth temperature described hereinabove. Furthermore, the results of Hall measurements show that the p-well doping has minimal impact on the room-temperature mobility as shown in the data depicted in FIG. 10(c).

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

Having thus described our invention, what we claim as new, and desire to secure by Letters Patent is:

1. A semiconductor layer structure comprising:
   a relaxed $Si_{1-x}Ge_x$ layer; wherein said relaxed $Si_{1-x}Ge_x$ layer is doped either partially or wholly p-type,
   a bottom $Si_{1-z}Ge_z$ buffer layer on top of said relaxed $Si_{1-x}Ge_x$ layer;
   a tensile tensile-strained Si quantum well layer on top of said bottom $Si_{1-z}Ge_z$ buffer layer;
   a top $Si_{1-m}Ge_m$ buffer layer on top of said tensile tensile-strained Si quantum well layer; and,
   a Si cap layer on top of said top $Si_{1-m}Ge_m$ buffer layer,
   wherein said relaxed bottom $Si_{1-z}Ge_z$ buffer layer, tensile-strained Si quantum well layer, and top $Si_{1-m}Ge_m$ buffer layer and Si cap layer are substantially undoped.

2. The semiconductor layer structure as claimed in claim 1, wherein the p-type portion of said relaxed $Si_{1-x}Ge_x$ layer has a dopant concentration between $10^{15}$ cm$^{-3}$ and $10^{19}$ cm$^{-3}$ and said relaxed $Si_{1-x}Ge_x$ layer has a Ge concentration x and relaxation, r, such that the in-plane lattice constant is 0.8–2.4% larger than that of bulk Si.

3. The semiconductor layer structure as claimed in claim 2, wherein:
   said bottom $Si_{1-z}Ge_z$ buffer layer is substantially lattice-matched to said relaxed $Si_{1-x}Ge_x$ layer and has a thickness ranging between 2 nm to 50 nm;
   said tensile tensile-strained Si quantum well layer has a thickness ranging between 2 nm to 30 nm; and
   said top $Si_{1-m}Ge_m$ buffer layer is substantially lattice-matched to said bottom $Si_{1-z}Ge_z$ buffer layer and has a thickness ranging between 2 to 20 nm.

4. The semiconductor layer structure as claimed in claim 3, wherein said relaxed $Si_{1-x}Ge_x$ layer is formed on top of an insulating layer.

5. The semiconductor layer structure as claimed in claim 4, further comprising:
   an insulating gate dielectric located on top of said Si cap layer;
   a gate electrode located on top of said insulating gate dielectric;
   n-type source and drain contact regions located on either side of said gate electrode, and extending from a surface of said structure down to said insulating layer;
   trench isolation regions on either side of drain and source contact regions that penetrate through said relaxed $Si_{1-x}Ge_x$ layer, and into said insulating layer.

6. The semiconductor layer structure as claimed in claim 1, further comprising:
   an insulating gate dielectric located on top of said Si cap layer;
   a gate electrode located on top of said insulating gate dielectric;
   n-type source and drain contact regions located on either side of said gate electrode, and extending from a surface of said structure down to the p-type doped portion of said relaxed $Si_{1-x}Ge_x$ layer;
   trench isolation regions on either side said drain and source contact regions that penetrate into said relaxed $Si_{1-x}Ge_x$ layer, whereby a high-performance field effect transistor device results.

7. The semiconductor layer structure as claimed in claim 6, wherein said insulating gate dielectric comprises one selected from the group comprising: an oxide, nitride, oxynitride of silicon, and oxides and silicates of Hf, Al, Zr, La, Y, Ta, singly or in combinations and the bottom portion of said gate electrode comprises polysilicon, polysilicongermanium, or the metals: Mo, Pt, Ir, W, Pd, Al, Au, Ni, Cu, Ti, and Co or their silicides and germanosilicides, either singly or in combinations.

8. A semiconductor layer structure comprising:
   a relaxed $Si_{1-x}Ge_x$ layer; wherein said relaxed $Si_{1-x}Ge_x$ layer is doped either partially or wholly p-type,
   a bottom $Si_{1-z}Ge_z$ buffer layer on top of said relaxed $Si_{1-x}Ge_x$ layer;
   a tensile tensile-strained Si quantum well layer on top of said bottom $Si_{1-z}Ge_z$ buffer layer;
   a top $Si_{1-m}Ge_m$ buffer layer on top of said tensile tensile-strained Si quantum well layer; and,
   a Si cap layer on top of said top $Si_{1-m}Ge_m$ buffer layer,
   wherein a portion of said top $Si_{1-m}Ge_m$ or bottom $Si_{1-z}Ge_z$ buffer layer or both top and bottom buffer layers adjacent to said Si quantum well is substantially undoped and a portion or entirety of the remaining regions of said bottom of $Si_{1-z}Ge_z$ buffer layer or top $Si_{1-m}Ge_m$ buffer layer or both buffers is doped n-type with a concentration ranging between $10^{17}$ cm$^{-3}$ to $10^{21}$ cm$^{-3}$.

9. The semiconductor layer structure as claimed in claim 8, where the thickness of the undoped portion of said bottom $Si_{1-z}Ge_z$ buffer layer or top $Si_{1-m}Ge_m$ buffer layer or both buffer layers adjacent to said Si quantum well is at least 0.5 nm.

10. The semiconductor layer structure as claimed in claim 8, wherein the p-type portion of said relaxed $Si_{1-x}Ge_x$ layer has a dopant concentration between $10^{15}$ cm$^{-3}$ and $10^{19}$ cm$^{-3}$ and said relaxed $Si_{1-x}Ge_x$ layer has a Ge concentration x and relaxation, r, such that the in-plane lattice constant is 0.8–2.4% larger than that of bulk Si.

11. The semiconductor layer structure as claimed in claim 8, wherein:
   said bottom $Si_{1-z}Ge_z$ buffer layer is substantially lattice-matched to said relaxed $Si_{1-x}Ge_x$ layer and has a thickness ranging between 2 nm to 50 nm;
   said tensile tensile-strained Si quantum well layer has a thickness ranging between 2 nm to 30 nm;
   said top $Si_{1-m}Ge_m$ buffer layer is substantially lattice-matched to said bottom $Si_{1-z}Ge_z$ buffer layer and has a thickness ranging between 2 nm to 20 nm.

12. The semiconductor layer structure as claimed in claim 11, wherein said relaxed $Si_{1-x}Ge_x$ layer is formed on top of an insulating layer.

13. The semiconductor layer structure as claimed in claim 12, further comprising:
   a gate electrode located on top of said Si cap layer;
   n-type source and drain contact regions located on either side of said gate electrode, and extending from a surface of said structure down to said insulating layer;

trench isolation regions on either side of drain and source contact regions that penetrate through said relaxed $Si_{1-x}Ge_x$ layer, and into said insulating layer.

14. The semiconductor layer structure as claimed in claim 13, further comprising an insulating gate dielectric located on top of said Si cap layer and below said gate electrode.

15. The semiconductor layer structure as claimed in claim 8, further comprising:
   a gate electrode located on top of said Si cap layer;
   n-type source and drain contact regions located on either side of said gate electrode, and extending from a surface of said structure down to the p-type doped portion of said relaxed $Si_{1-x}Ge_x$ layer;
   trench isolation regions on either side said drain and source contact regions that penetrate into said relaxed $Si_{1-x}Ge_x$ layer, whereby a high-performance field effect transistor device results.

16. The semiconductor layer structure as claimed in claim 15, further comprising an insulating gate dielectric located on top of said Si cap layer and below said gate electrode.

17. A semiconductor layer structure comprising:
   a relaxed $Si_{1-x}Ge_x$ layer; wherein said relaxed $Si_{1-x}Ge_x$ layer is doped either partially or wholly p-type,
   an interposer $Si_{1-y}Ge_y$ layer on top of said relaxed $Si_{1-x}Ge_x$ layer;
   a bottom $Si_{1-z}Ge_z$ buffer layer on top of said interposer $Si_{1-y}Ge_y$ layer;
   a tensile tensile-strained Si quantum well layer on top of said bottom $Si_{1-z}Ge_z$ buffer layer;
   a top $Si_{1-m}Ge_m$ buffer layer on top of said tensile tensile-strained Si quantum well layer;
   a Si cap layer on top of said top $Si_{1-m}Ge_m$ buffer layer, wherein said relaxed bottom $Si_{1-z}Ge_z$ buffer layer, tensile-strained Si quantum well layer, top $Si_{1-m}Ge_m$ buffer layer and Si cap layer are substantially undoped.

18. The semiconductor layer structure as claimed in claim 17, wherein the p-type portion of said relaxed $Si_{1-x}Ge_x$ layer has a dopant concentration between $10^{15}$ cm$^{-3}$ and $10^{19}$ cm$^{-3}$ and said relaxed $Si_{1-x}Ge_x$ layer has a Ge concentration x and relaxation, r, such that the in-plane lattice constant is 0.8–2.4% larger than that of bulk Si.

19. The semiconductor layer structure as claimed in claim 18, wherein:
   said interposer $Si_{1-y}Ge_y$ layer has Ge concentration, y, in the range of 0 to 20%, and thickness less than 5 nm;
   said bottom $Si_{1-z}Ge_z$ buffer layer is substantially lattice-matched to said relaxed $Si_{1-x}Ge_x$ layer and has a thickness ranging between 2 nm to 50 nm;
   said tensile tensile-strained Si quantum well layer has a thickness ranging between 2 nm to 30 nm; and,
   said top $Si_{1-m}Ge_m$ buffer layer is substantially lattice-matched to said bottom $Si_{1-z}Ge_z$ buffer layer and has a thickness ranging between 2 nm to 20 nm.

20. The semiconductor layer structure as claimed in claim 19, wherein said relaxed $Si_{1-x}Ge_x$ layer is formed on top of an insulating layer.

21. The semiconductor layer structure as claimed in claim 20, further comprising:
   an insulating gate dielectric located on top of said Si cap layer;
   a gate electrode located on top of said insulating gate dielectric;
   n-type source and drain contact regions located on either side of said gate electrode, and extending from a surface of said structure down to said insulating layer;
   trench isolation regions on either side of drain and source contact regions that penetrate through said relaxed $Si_{1-x}Ge_x$ layer, and into said insulating layer.

22. The semiconductor layer structure as claimed in claim 21, wherein the bottom portion of said gate electrode comprises one selected from the group comprising: polysilicon, polysilicongermanium, or metals: Mo, W, Al, Au, Ni, Cu, Ti, and Co or their silicides and germanosilicides, either singly or in combinations.

23. The semiconductor layer structure as claimed in claim 19, wherein:
   said interposer $Si_{1-y}Ge_y$ layer has Ge concentration, y, in the range of 0 to 20%, and thickness less than 5 nm;
   said bottom $Si_{1-z}Ge_z$ buffer layer is substantially lattice-matched to said relaxed $Si_{1-x}Ge_x$ layer and has a thickness ranging between 2 nm to 50 nm;
   said tensile tensile-strained Si quantum well layer has a thickness ranging between 2 nm to 30 nm;
   said top $Si_{1-m}Ge_m$ buffer layer is substantially lattice-matched to said bottom $Si_{1-z}Ge_z$ buffer layer and has a thickness ranging between 2 nm to 20 nm.

24. The semiconductor layer structure as claimed in claim 23, wherein said relaxed $Si_{1-x}Ge_x$ layer is formed on top of an insulating layer.

25. The semiconductor layer structure as claimed in claim 24, further comprising:
   a gate electrode located on top of said Si cap layer;
   n-type source and drain contact regions located on either side of said gate electrode, and extending from a surface of said structure down to said insulating layer;
   trench isolation regions on either side of drain and source contact regions that penetrate through said relaxed $Si_{1-x}Ge_x$ layer, and into said insulating layer.

26. The semiconductor layer structure as claimed in claim 25, further comprising an insulating gate dielectric located on top of said Si cap layer and below said gate electrode.

27. The semiconductor layer structure as claimed in claim 17, further comprising:
   an insulating gate dielectric located on top of said Si cap layer;
   a gate electrode located on top of said insulating gate dielectric;
   n-type source and drain contact regions located on either side of said gate electrode, and extending from a surface of said structure down to the p-type doped portion of said relaxed $Si_{1-x}Ge_x$ layer;
   trench isolation regions on either side said drain and source contact regions that penetrate into said relaxed $Si_{1-x}Ge_x$ layer, whereby a high-performance field effect transistor device results.

28. The semiconductor layer structure as claimed in claim 27, wherein the bottom portion of said gate electrode comprises one selected from the group comprising: polysilicon, polysilicongermanium, or metals: Pt, Ir and Pd or their silicides and germanosilicides, either singly or in combinations.

29. A semiconductor layer structure comprising:
   a relaxed $Si_{1-x}Ge_x$ layer; wherein said relaxed $Si_{1-x}Ge_x$ layer is doped either partially or wholly p-type,
   an interposer $Si_{1-y}Ge_y$ layer on top of said relaxed $Si_{1-x}Ge_x$ layer;
   a bottom $Si_{1-z}Ge_z$ buffer layer on top of said interposer $Si_{1-y}Ge_y$ layer;
   a tensile tensile-strained Si quantum well layer on top of said bottom $Si_{1-z}Ge_z$ buffer layer;

a top $Si_{1-m}Ge_m$ buffer layer on top of said tensile tensile-strained Si quantum well layer; a Si cap layer on top of said top $Si_{1-m}Ge_m$ buffer layer, wherein a portion of said bottom $Si_{1-z}Ge_z$ buffer layer or top $Si_{1-m}Ge_m$ buffer layer or both buffer layers adjacent to said Si quantum well is substantially undoped and a portion or entirety of the remaining regions of said bottom $Si_{1-z}Ge_z$ buffer layer or top $Si_{1-m}Ge_m$ buffer layer or both buffer layers is doped n-type with a concentration ranging between $10^{17}$ cm$^{-3}$ to $10^{21}$ cm$^{-3}$.

30. The semiconductor layer structure as claimed in claim 29, where the thickness of the undoped portion of said bottom $Si_{1-z}Ge_z$ buffer layer or top $Si_{1-m}Ge_m$ buffer layer or both buffer layers adjacent to said Si quantum well is at least 0.5 nm.

31. The semiconductor layer structure as claimed in claim 29, wherein the p-type portion of said relaxed $Si_{1-x}Ge_x$ layer has a dopant concentration between $10^{15}$ cm$^{-3}$ and $10^{19}$ cm$^{-3}$ and said relaxed $Si_{1-x}Ge_x$ layer has a Ge concentration x and relaxation, r, such that the in-plane lattice constant is 0.8–2.4% larger than that of bulk Si.

32. The semiconductor layer structure as claimed in claim 29, further comprising:

a gate electrode located on top of said Si cap layer;

n-type source and drain contact regions located on either side of said gate electrode, and extending from a surface of said structure down to the p-type doped portion of said relaxed $Si_{1-x}Ge_x$ layer;

trench isolation regions on either side said drain and source contact regions that penetrate into said relaxed $Si_{1-x}Ge_x$ layer, whereby a high-performance field effect transistor device results.

33. The semiconductor layer structure as claimed in claim 32, further comprising an insulating gate dielectric located on top of said Si cap layer and below said gate electrode.

34. A semiconductor layer structure comprising:

a relaxed $Si_{1-x}Ge_x$ layer; wherein said relaxed $Si_{1-x}Ge_x$ layer is doped either partially or wholly n-type, a bottom $Si_{1-z}Ge_z$ buffer layer on top of said relaxed $Si_{1-x}Ge_x$ layer;

a compressive-strained $Si_{1-v}Ge_v$ quantum well layer on top of said bottom $Si_{1-z}Ge_z$ buffer layer;

a top $Si_{1-m}Ge_m$ buffer layer on top of said compressive-strained Si quantum well layer;

a Si cap layer on top of said top $Si_{1-m}Ge_m$ buffer layer, wherein said relaxed bottom $Si_{1-z}Ge_z$ buffer layer, compressive-strained $Si_{1-v}Ge_v$ quantum well layer, top $Si_{1-m}Ge_m$ buffer layer and Si cap layer are substantially undoped.

35. The semiconductor layer structure as claimed in claim 34, wherein said compressive-strained $Si_{1-v}Ge_v$ quantum well layer has a Ge concentration, v, such that v>z+0.3.

36. The semiconductor layer structure as claimed in claim 35, wherein the n-type portion of said relaxed $Si_{1-x}Ge_x$ layer has a dopant concentration between $10^{15}$ cm$^{-3}$ and $10^{19}$ cm$^{-3}$ and said relaxed $Si_{1-x}Ge_x$ layer has a Ge concentration x and relaxation, r, such that the in-plane lattice constant is 0–3.2% larger than that of bulk Si.

37. The semiconductor layer structure as claimed in claim 36, wherein:

said bottom $Si_{1-z}Ge_z$ buffer layer is substantially lattice-matched to said relaxed $Si_{1-x}Ge_x$ layer and has a thickness ranging between 2 nm to 50 nm;

said compressive-strained $Si_{1-v}Ge_v$ quantum well layer has a thickness ranging between 2 nm to 30 nm;

said top $Si_{1-m}Ge_m$ buffer layer is substantially lattice-matched to said bottom $Si_{1-z}Ge_z$ buffer layer and has a thickness ranging between 2 nm to 30 nm; and, said Si cap layer has a thickness ranging between 0 nm to 5 nm.

38. The semiconductor layer structure as claimed in claim 37, wherein said relaxed $Si_{1-x}Ge_x$ layer is formed on top of an insulating layer.

39. The semiconductor layer structure as claimed in claim 38, further comprising:

an insulating gate dielectric located on top of said Si cap layer;

a gate electrode located on top of said insulating gate dielectric;

p-type source and drain contact regions located on either side of said gate electrode, and extending from a surface of said structure down to said insulating layer;

trench isolation regions on either side of drain and source contact regions that penetrate through said relaxed $Si_{1-x}Ge_x$ layer, and into said insulating layer.

40. The semiconductor layer structure as claimed in claim 34, further comprising:

an insulating gate dielectric located on top of said Si cap layer;

a gate electrode located on top of said insulating gate dielectric;

p-type source and drain contact regions located on either side of said gate electrode, and extending from a surface of said structure down to the p-type doped portion of said relaxed $Si_{1-x}Ge_x$ layer;

trench isolation regions on either side said drain and source contact regions that penetrate into said relaxed $Si_{1-x}Ge_x$ layer, whereby a high-performance field effect transistor device results.

41. A semiconductor layer structure comprising:

a relaxed $Si_{1-x}Ge_x$ layer; wherein said relaxed $Si_{1-x}Ge_x$ layer is doped either partially or wholly n-type, a bottom $Si_{1-z}Ge_z$ buffer layer on top of said relaxed $Si_{1-x}Ge_x$ layer;

a compressive-strained $Si_{1-v}Ge_v$ quantum well layer on top of said bottom $Si_{1-z}Ge_z$ buffer layer;

a top $Si_{1-m}Ge_m$ buffer layer on top of said compressive-strained Si quantum well layer; a Si cap layer on top of said top $Si_{1-m}Ge_m$ buffer layer, wherein a portion of said bottom $Si_{1-z}Ge_z$ buffer layer or top $Si_{1-m}Ge_m$ buffer layer or both buffer layers adjacent to said $Si_{1-v}Ge_v$ quantum well layer is substantially undoped and a portion or entirety of the remaining regions of said bottom $Si_{1-z}Ge_z$ buffer layer or top $Si_{1-m}Ge_m$ buffer layer or both buffer layers is doped p-type with a concentration ranging between $10^{17}$ cm$^{-3}$ to $10^{21}$ cm$^{-3}$.

42. The semiconductor layer structure as claimed in claim 41, where the thickness of the undoped portion of said bottom $Si_{1-z}Ge_z$ buffer layer or top $Si_{1-m}Ge_m$ buffer layer or both buffer layers adjacent to said $Si_{1-v}Ge_v$ quantum well is at least 0.5 nm.

43. The semiconductor layer structure as claimed in claim 42, wherein said compressive-strained $Si_{1-v}Ge_v$ quantum well layer has a Ge concentration, v, such that v>z+0.3.

44. The semiconductor layer structure as claimed in claim 43, wherein the n-type portion of said relaxed $Si_{1-x}Ge_x$ layer has a dopant concentration between $10^{15}$ cm$^{-3}$ and $10^{19}$ cm$^{-3}$ and said relaxed $Si_{1-x}Ge_x$ layer has a Ge concentration x and relaxation, r, such that the in-plane lattice constant is 0–3.2% larger than that of bulk Si.

15

45. The semiconductor layer structure as claimed in claim 44, wherein:
said bottom $Si_{1-z}Ge_z$ buffer layer is substantially lattice-matched to said relaxed $Si_{1-x}Ge_x$ layer and has a thickness ranging between 2 nm to 50 nm;
said compressive-strained $Si_{1-v}Ge_v$ quantum well layer has a thickness ranging between 2 nm to 30 nm;
said top $Si_{1-m}Ge_m$ buffer layer is substantially lattice-matched to said bottom $Si_{1-z}Ge_z$ buffer layer and has a thickness ranging between 2 nm to 30 nm; AND,
said Si cap layer has a thickness ranging between 0 nm to 5 nm.

46. The semiconductor layer structure as claimed in claim 45, wherein said relaxed $Si_{1-x}Ge_x$ layer is formed on top of an insulating layer.

47. The semiconductor layer structure as claimed in claim 46, further comprising:
a gate electrode located on top of said Si cap layer;
p-type source and drain contact regions located on either side of said gate electrode, and extending from a surface of said multi-layer structure down to said buried oxide layer;
trench isolation regions on either side of drain and source contact regions that penetrate through said relaxed $Si_{1-x}Ge_x$ layer, and into said insulating layer.

48. The semiconductor layer structure as claimed in claim 47, further comprising an insulating gate dielectric located on top of said Si cap layer and below said gate electrode.

49. The semiconductor layer structure as claimed in claim 41, further comprising:
a gate electrode located on top of said Si cap layer;
p-type source and drain contact regions located on either side of said gate electrode, and extending from a surface of said structure down to the p-type doped portion of said relaxed $Si_{1-x}Ge_x$ layer;
trench isolation regions on either side said drain and source contact regions that penetrate into said relaxed $Si_{1-x}Ge_x$ layer, whereby a high-performance field effect transistor device results.

50. The semiconductor layer structure as claimed in claim 49, further comprising an insulating gate dielectric located on top of said Si cap layer and below said gate electrode.

51. A semiconductor layer structure comprising:
a relaxed $Si_{1-x}Ge_x$ layer; wherein said relaxed $Si_{1-x}Ge_x$ layer is doped either partially or wholly n-type,
an interposer $Si_{1-y}Ge_y$ layer on top of said relaxed $Si_{1-x}Ge_x$ layer;
a bottom $Si_{1-z}Ge_z$ buffer layer on top of said interposer $Si_{1-y}Ge_y$ layer;
a compressive-strained $Si_{1-v}Ge_v$ quantum well layer on top of said bottom $Si_{1-z}Ge_z$ buffer layer;
a top $Si_{1-m}Ge_m$ buffer layer on top of said compressive-strained Si quantum well layer;
a Si cap layer on top of said top $Si_{1-m}Ge_m$ buffer layer,
wherein said relaxed bottom $Si_{1-z}Ge_z$ buffer layer, compressive-strained $Si_{1-v}Ge_v$ quantum well layer, top $Si_{1-m}Ge_m$ buffer layer and Si cap layer are substantially undoped.

52. The semiconductor layer structure as claimed in claim 51, wherein said compressive-strained $Si_{1-v}Ge_v$ quantum well layer has a Ge concentration, v, such that v>z+0.3.

53. The semiconductor layer structure as claimed in claim 52, wherein the n-type portion of said relaxed $Si_{1-x}Ge_x$ layer has a dopant concentration between $10^{15}$ cm$^{-3}$ and $10^{19}$ cm$^{-3}$ and said relaxed $Si_{1-x}Ge_x$ layer has a Ge concentration x and relaxation, r, such that the in-plane lattice constant is 0–3.2% larger than that of bulk Si.

54. The semiconductor layer structure as claimed in claim 53, wherein:
said interposer $Si_{1-y}Ge_y$ layer has Ge concentration, y, in the range of 0 to 20%, and thickness less than 5 nm;
said bottom $Si_{1-z}Ge_z$ buffer layer is substantially lattice-matched to said relaxed $Si_{1-x}Ge_x$ layer and has a thickness ranging between 2 nm to 50 nm;
said compressive-strained $Si_{1-v}Ge_v$ quantum well layer has a thickness ranging between 2 nm to 30 nm;
said top $Si_{1-m}Ge_m$ buffer layer is substantially lattice-matched to said bottom $Si_{1-z}Ge_z$ buffer layer and has a thickness ranging between 2 nm to 20 nm; and,
said Si cap layer has a thickness ranging between 0 nm to 5 nm.

55. The semiconductor layer structure as claimed in claim 54, wherein said relaxed $Si_{1-x}Ge_x$ layer is formed on top of an insulating layer.

56. The semiconductor layer structure as claimed in claim 55, further comprising:
an insulating gate dielectric located on top of said Si cap layer;
a gate electrode located on top of said insulating gate dielectric;
p-type source and drain contact regions located on either side of said gate electrode, and extending from a surface of said structure down to said insulating layer;
trench isolation regions on either side of drain and source contact regions that penetrate through said relaxed $Si_{1-x}Ge_x$ layer, and into said insulating layer.

57. The semiconductor layer structure as claimed in claim 51, further comprising:
an insulating gate dielectric located on top of said Si cap layer;
a gate electrode located on top of said insulating gate dielectric;
p-type source and drain contact regions located on either side of said gate electrode, and extending from a surface of said structure down to the p-type doped portion of said relaxed $Si_{1-x}Ge_x$ layer;
trench isolation regions on either side said drain and source contact regions that penetrate into said relaxed $Si_{1-x}Ge_x$ layer, whereby a high-performance field effect transistor device results.

58. A semiconductor layer structure comprising:
a relaxed $Si_{1-x}Ge_x$ layer; wherein said relaxed $Si_{1-x}Ge_x$ layer is doped either partially or wholly n-type,
an interposer $Si_{1-y}Ge_y$ layer on top of said relaxed $Si_{1-x}Ge_x$ layer;
a bottom $Si_{1-z}Ge_z$ buffer layer on top of said interposer $Si_{1-y}Ge_y$ layer;
a compressive-strained $Si_{1-v}Ge_v$ quantum well layer on top of said bottom $Si_{1-z}Ge_z$ buffer layer;
a top $Si_{1-m}Ge_m$ buffer layer on top of said compressive-strained Si quantum well layer;
a Si cap layer on top of said top $Si_{1-m}Ge_m$ buffer layer,
wherein a portion of said bottom $Si_{1-z}Ge_z$ buffer layer or top $Si_{1-m}Ge_m$ buffer layer or both buffer layers adjacent to said $Si_{1-v}Ge_v$ quantum well layer is substantially undoped and a portion or entirety of the remaining regions of said bottom $Si_{1-z}Ge_z$ buffer layer or top $Si_{1-m}Ge_m$ buffer layer or both buffer layers is doped p-type with a concentration ranging between $10^{17}$ cm$^{-3}$ to $10^{21}$ cm$^{-3}$.

59. The semiconductor layer structure as claimed in claim 58, where the thickness of the undoped portion of said bottom $Si_{1-z}Ge_z$ buffer layer or top $Si_{1-m}Ge_m$ buffer layer or both buffer layers adjacent to said $Si_{1-v}Ge_v$ quantum well is at least 0.5 nm.

60. The semiconductor layer structure as claimed in claim 59, wherein said compressive-strained $Si_{1-v}Ge_v$ quantum well layer has a Ge concentration, v, such that v>z+0.3.

61. The semiconductor layer structure as claimed in claim 60, wherein the n-type portion of said relaxed $Si_{1-x}Ge_x$ layer has a dopant concentration between $10^{15}$ cm$^{-3}$ and $10^{19}$ cm$^{-3}$ and said relaxed $Si_{1-x}Ge_x$ layer has a Ge concentration x and relaxation, r, such that the in-plane lattice constant is 0–3.2% larger than that of bulk Si.

62. The semiconductor layer structure as claimed in claim 61, wherein:
   said interposer $Si_{1-y}Ge_y$ layer has Ge concentration, y, in the range of 0 to 20%, and thickness less than 5 nm;
   said bottom $Si_{1-z}Ge_z$ buffer layer is substantially lattice-matched to said relaxed $Si_{1-x}Ge_x$ layer and has a thickness ranging between 2 nm to 50 nm;
   said compressive-strained $Si_{1-v}Ge_v$ quantum well layer has a thickness ranging between 2 nm to 30 nm;
   said top $Si_{1-m}Ge_m$ buffer layer is substantially lattice-matched to said bottom $Si_{1-z}Ge_z$ buffer layer and has a thickness ranging between 2 nm to 20 nm.

63. The semiconductor layer structure as claimed in claim 58, wherein said relaxed $Si_{1-x}Ge_x$ layer is formed on top of an insulating layer.

64. The semiconductor layer structure as claimed in claim 63, further comprising:
   a gate electrode located on top of said Si cap layer;
   p-type source and drain contact regions located on either side of said gate electrode, and extending from a surface of said multi-layer structure down to said buried oxide layer;
   trench isolation regions on either side of drain and source contact regions that penetrate through said relaxed $Si_{1-x}Ge_x$ layer, and into said insulating layer.

65. The semiconductor layer structure as claimed in claim 64, further comprising an insulating gate dielectric located on top of said Si cap layer and below said gate electrode.

66. The semiconductor layer structure as claimed in claim 58, further comprising:
   a gate electrode located on top of said Si cap layer;
   p-type source and drain contact regions located on either side of said gate electrode, and extending from a surface of said structure down to the p-type doped portion of said relaxed $Si_{1-x}Ge_x$ layer;
   trench isolation regions on either side said drain and source contact regions that penetrate into said relaxed $Si_{1-x}Ge_x$ layer, whereby a high-performance field effect transistor device results.

67. The semiconductor layer structure as claimed in claim 66, further comprising an insulating gate dielectric located on top of said Si cap layer and below said gate electrode.

* * * * *

UNITED STATES PATENT AND TRADEMARK OFFICE
CERTIFICATE OF CORRECTION

PATENT NO.         : 6,949,761 B2
APPLICATION NO. : 10/685013
DATED                  : September 27, 2005
INVENTOR(S)       : Jack O. Chu et al.

It is certified that error appears in the above-identified patent and that said Letters Patent is hereby corrected as shown below:

Title Page:
"(75) Jack O. Chu, Manhasser Hills, NY"

should read

-- (75) Jack O. Chu, Manhasset Hills, NY --

Column 9, Line 28, Claim 1:
"a Si cap layer on top of said top"

should read

-- a Si cap layer under tensile strain on top of said top --

Column 9, Line 47, Claim 3:
"between 2 to 20nm" should read -- between 2 nm to nm.--

Column 10, Line 28, Claim 8:
"a Si cap layer on top of said top"

should read

-- a Si cap layer under tensile strain on top of said top --

Column 11, Line 33, Claim 17:
"a Si cap layer on top of said top"

should read

-- a Si cap layer under tensile strain on top of said top --

Column 13, Line 2, Claim 29:
"a Si cap layer on top of said top"

should read

-- a Si cap layer under tensile strain on top of said top --

Column 13, Line 46, Claim 34:
"a Si cap layer on top of said top"

UNITED STATES PATENT AND TRADEMARK OFFICE
CERTIFICATE OF CORRECTION

PATENT NO. : 6,949,761 B2  
APPLICATION NO. : 10/685013  
DATED : September 27, 2005  
INVENTOR(S) : Jack O. Chu et al.

It is certified that error appears in the above-identified patent and that said Letters Patent is hereby corrected as shown below:

should read

-- a Si cap layer under tensile strain on top of said top --

Column 14, Line 44, Claim 41:
"a Si cap layer on top of said top"

should read

-- a Si cap layer under tensile strain on top of said top --

Column 15, Line 57, Claim 51:
"a Si cap layer on top of said top"

should read

-- a Si cap layer under tensile strain on top of said top --

Column 16, Line 61, Claim 58:
"a Si cap layer on top of said top"

should read

-- a Si cap layer under tensile strain on top of said top --

Signed and Sealed this

Eleventh Day of March, 2008

JON W. DUDAS  
*Director of the United States Patent and Trademark Office*